US009831157B2

(12) United States Patent
Sunachi et al.

(10) Patent No.: US 9,831,157 B2
(45) Date of Patent: Nov. 28, 2017

(54) METHOD OF ATTACHING AN ELECTRONIC PART TO A COPPER PLATE HAVING A SURFACE ROUGHNESS

(71) Applicant: DOWA METALTECH CO., LTD., Tokyo (JP)

(72) Inventors: Naoya Sunachi, Nagano (JP); Hideyo Osanai, Nagano (JP); Satoru Kurita, Okayama (JP)

(73) Assignee: Dowa Metaltech Co., Ltd., Tokyo (JP)

( * ) Notice: Subject to any disclaimer, the term of this patent is extended or adjusted under 35 U.S.C. 154(b) by 0 days.

(21) Appl. No.: 14/917,095

(22) PCT Filed: Sep. 2, 2014

(86) PCT No.: PCT/JP2014/073599
§ 371 (c)(1),
(2) Date: Mar. 7, 2016

(87) PCT Pub. No.: WO2015/034078
PCT Pub. Date: Mar. 12, 2015

(65) Prior Publication Data

US 2016/0211195 A1 Jul. 21, 2016

(30) Foreign Application Priority Data

Sep. 9, 2013 (JP) ................................ 2013-185997

(51) Int. Cl.
*H01L 21/00* (2006.01)
*H01L 23/48* (2006.01)
(Continued)

(52) U.S. Cl.
CPC ...... *H01L 23/4924* (2013.01); *H01L 21/4846* (2013.01); *H01L 21/4878* (2013.01);
(Continued)

(58) Field of Classification Search
CPC ... H01L 24/32; H01L 23/49513; H01L 24/83; H01L 23/4924; H01L 23/3735; H01L 23/3736; H01L 21/4846; H01L 21/4878
See application file for complete search history.

(56) References Cited

U.S. PATENT DOCUMENTS 5,654,586 A 8/1997 Schwarzbauer
6,261,703 B1 7/2001 Sasaki et al.
(Continued)

FOREIGN PATENT DOCUMENTS

JP 01135057 A * 5/1989
JP 08158027 A 6/1996
(Continued)

OTHER PUBLICATIONS

International Search Report for PCT/JP2014/073599 dated Nov. 12, 2014.
(Continued)

*Primary Examiner* — Alonzo Chambliss
(74) *Attorney, Agent, or Firm* — Bachman & LaPointe, PC

(57) ABSTRACT

In a method for producing an electronic part mounting substrate wherein an electronic part 14 is mounted on one major surface (a surface to which the electronic part 14 is to be bonded) of the metal plate 10 of copper, or aluminum or the aluminum alloy (when a plating film 20 of copper is formed on the surface), the one major surface of the metal plate 10 (or the surface of the plating film 20 of copper) is surface-machined to be coarsened so as to have a surface roughness of not less than 0.4 μm, and then, a silver paste is applied on the surface-machined major surface (or the surface-machined surface of the plating film 20 of copper) to arrange the electronic part 14 thereon to sinter silver in the silver paste to form a silver bonding layer 12 to bond the electronic part 14 to the one major surface of the metal plate (Continued)

14
12
20
10
16
18

14
12
20
10
16
18

10 (or the surface of the plating film 20 of copper) with the silver bonding layer 12.

7 Claims, 1 Drawing Sheet

(51) Int. Cl.

| | |
|---|---|
| ***H01L 23/492*** | (2006.01) |
| ***H01L 23/373*** | (2006.01) |
| ***H05K 3/34*** | (2006.01) |
| ***H01L 21/48*** | (2006.01) |
| ***H01L 23/498*** | (2006.01) |
| *H05K 1/05* | (2006.01) |
| *H01L 23/00* | (2006.01) |

(52) U.S. Cl.

CPC ...... *H01L 23/3735* (2013.01); *H01L 23/3736* (2013.01); *H01L 23/498* (2013.01); *H01L 24/32* (2013.01); *H01L 24/83* (2013.01); *H05K 3/3431* (2013.01); *H01L 24/29* (2013.01); *H01L 2224/04026* (2013.01); *H01L 2224/05644* (2013.01); *H01L 2224/27442* (2013.01); *H01L 2224/29139* (2013.01); *H01L 2224/29339* (2013.01); *H01L 2224/29394* (2013.01); *H01L 2224/32225* (2013.01); *H01L 2224/32245* (2013.01); *H01L 2224/75315* (2013.01); *H01L 2224/83009* (2013.01); *H01L 2224/8384* (2013.01); *H01L 2224/83192* (2013.01); *H01L 2224/83203* (2013.01); *H01L 2224/83385* (2013.01); *H01L 2224/83447* (2013.01); *H01L 2924/01046* (2013.01); *H01L 2924/01047* (2013.01); *H01L 2924/01079* (2013.01); *H05K 1/053* (2013.01); *H05K 2203/0307* (2013.01); *Y02P 70/613* (2015.11)

(56) References Cited

U.S. PATENT DOCUMENTS

| | | | | |
|---|---|---|---|---|
| 8,420,446 | B2 * | 4/2013 | Yo | C25D 5/12 257/E21.505 |
| 2007/0052070 | A1 * | 3/2007 | Islam | H01L 21/561 257/666 |
| 2009/0039486 | A1 * | 2/2009 | Shimazaki | H01L 21/561 257/676 |
| 2011/0117704 | A1 * | 5/2011 | Shimazaki | C25D 5/12 438/123 |
| 2014/0147695 | A1 * | 5/2014 | Sunachi | H01L 23/3735 428/612 |
| 2015/0043129 | A1 * | 2/2015 | Yamanaka | H01G 9/012 361/528 |

FOREIGN PATENT DOCUMENTS

| | | | |
|---|---|---|---|
| JP | 8-509844 | A | 10/1996 |
| JP | 2004022852 | A | 1/2004 |
| JP | 2006179537 | A | 7/2006 |
| JP | 2006-202586 | A | 8/2006 |
| JP | 2007-208082 | A | 8/2007 |
| JP | 2011-73194 | A | 4/2011 |
| JP | 2011-80147 | A | 4/2011 |
| WO | 98/54761 | A1 | 12/1998 |

OTHER PUBLICATIONS

Schmitt et al., "Sinter Materials for broad process windows in DCB packages—concepts and results", Integrated Power Electronics Systems (CIPS), 2012 7th International Conference on, VDE Verlag GMBH, Mar. 6, 2012, pp. 1-6.

Wereszczak et al., "Sintered Silver Joint Strength Dependence on Substrate Topography and Attachment Pad Geometry", Integrated Power Electronics Systems (CIPS), 2012 7th International Conference on, VDE Verlag GMBH, Mar. 6, 2012, pp. 1-6.

Supplementary European search report for Application No. 14 84 2159 dated Jun. 19, 2017.

* cited by examiner

METHOD OF ATTACHING AN ELECTRONIC PART TO A COPPER PLATE HAVING A SURFACE ROUGHNESS

TECHNICAL FIELD

The present invention generally relates to an electronic part mounting substrate and a method for producing the same. More specifically, the invention relates to an electronic part mounting substrate wherein an electronic part, such as a semiconductor chip, is mounted on one side of a copper plate or copper-plated plate of a metal/ceramic bonding substrate wherein the other side of the copper plate or copper-plated plate is bonded to a ceramic substrate, and a method for producing the same.

BACKGROUND ART

Power modules have been used for controlling heavy-current for electric vehicles, electric railcars, machine tools and so forth. In a conventional power module, a metal/ceramic insulating substrate is fixed to one side of a metal plate or compound material called base plate, and semiconductor chips are fixed to a metal circuit plate of the metal/ceramic insulating substrate by soldering.

In recent years, it is proposed that a silver paste containing fine silver particles is used as a bonding agent to be arranged between articles, such as copper plates, to be heated for a predetermined period of time while pressing the articles against each other, to sinter silver in the bonding agent to bond the articles to each other (see, e.g., Japanese Patent Laid-Open No. 2011-80147). It is attempted that such a bonding agent of a silver paste containing fine silver particles is substituted for solder to fix electronic parts, such as semiconductor chips, on a metal plate of a metal/ceramic insulating substrate.

As such a method for fixing electronic parts on a substrate, there is provided a method for arranging silver nanoparticles, which can be sintered at a low temperature, between the terminal of a semiconductor device and the electrode of the substrate to sinter the silver nanoparticles to bond the terminal of the semiconductor device to the electrode of the substrate (see, e.g., Japanese Patent Laid-Open No. 2007-208082).

There is also provided a method for arranging a metal nanoparticle paste, which contains silver nanoparticles dispersed in an organic solvent, between the silver portion of a semiconductor device and a copper circuit plate on a ceramic insulating substrate to heat the paste to bond the silver portion to the copper circuit plate (see, e.g., Japanese Patent Laid-Open No. 2006-202586). In this method, the surface of a copper circuit plate, which is to be bonded to the silver portion of the semiconductor device, has a recessed portion which is beneficial to the large area of the surface of the copper circuit plate bonded to the silver portion of the semiconductor device.

However, in the methods disclosed in Japanese Patent Laid-Open Nos. 2011-80147, 2007-208082 and 2006-202586, if a copper plate or a copper-plated plate (an aluminum plate plated with copper) is used as a metal plate (for mounting thereon electronic parts) to bond electronic parts, such as semiconductor chips, on the metal plate with a bonding agent of a silver paste, it is not possible to bond them on such a good bonding state that the number of bonding defects is small, and it is not possible to maintain the good bonding state if heat cycles are applied thereon.

DISCLOSURE OF THE INVENTION

It is therefore an object of the present invention to eliminate the aforementioned conventional problems and to provide an electronic part mounting substrate having an excellent resistance to thermal shock, which has an electronic part bonded on a copper plate or copper-plated plate in such a good bonding state that the number of bonding defects is small and which can maintain the good bonding state if heat cycles are applied thereon, and a method for producing the same.

In order to accomplish the aforementioned and other objects, the inventors have diligently studied and found that it is possible to bond an electronic part on a copper plate or copper-plated plate in such a good bonding state that the number of bonding defects is small and to maintain the good bonding state if heat cycles are applied thereon, when there is carried out a method for producing an electronic part mounting substrate wherein an electronic part is mounted on one side of a copper plate or copper-plated plate, the method comprising the steps of: surface-machining the one side of the copper plate or copper-plated plate to cause the surface roughness thereof to be 0.4 μm or more; applying a silver paste on the surface-machined side of the copper plate or copper-plated plate; arranging the electronic part on the silver paste applied on the surface-machined side of the copper plate or copper-plated plate; and sintering silver in the silver paste to form a silver bonding layer to bond the electronic part to the surface-machined side of the copper plate or copper-plated plate with the silver bonding layer.

According to the present invention, there is provided a method for producing an electronic part mounting substrate wherein an electronic part is mounted on one side of a copper plate or copper-plated plate, the method comprising the steps of: surface-machining the one side of the copper plate or copper-plated plate to cause the surface roughness thereof to be 0.4 μm or more; applying a silver paste on the surface-machined side of the copper plate or copper-plated plate; arranging the electronic part on the silver paste applied on the surface-machined side of the copper plate or copper-plated plate; and sintering silver in the silver paste to form a silver bonding layer to bond the electronic part to the surface-machined side of the copper plate or copper-plated plate with the silver bonding layer.

In this method for producing an electronic part mounting substrate, the surface machining is preferably a wet blasting. The copper plate or copper-plated plate is preferably annealed before the silver paste is applied after the surface machining is carried out. The annealing preferably causes the copper plate or copper-plated plate to have a Vickers hardness Hv of not greater than 40. The sintering of silver in the silver paste is preferably carried out by heating while pressing the electronic part against the copper plate or copper-plated plate. A surface of the electronic part to be bonded to the surface-machined side of the copper plate or copper-plated plate is preferably plated with at least one metal, which is selected from the group consisting of gold, silver and palladium, or an alloy thereof. One side of a ceramic substrate is preferably bonded to the other side of the copper plate or copper-plated plate. A metal base plate is preferably bonded to the other side of the ceramic substrate.

According to the present invention, there is provided an electronic part mounting substrate comprising: a copper plate or copper-plated plate, one side of the copper plate or copper-plated plate having a surface roughness of not less than 0.4 μm; a silver bonding layer formed on the one side of the copper plate or copper-plated plate; and an electronic part bonded to the one side of the copper plate or copper-plated plate with the silver bonding layer.

In this electronic part mounting substrate, the surface roughness of the one side of the copper plate or copper-plated plate is preferably in the range of from 0.5 μm to 2.0 μm. The one side of the copper plate or copper-plated plate preferably has a Vickers hardness Hv of not greater than 100, and more preferably has a Vickers hardness Hv of not greater than 40. A surface of the electronic part to be bonded to the one side of the copper plate or copper-plated plate is preferably plated with at least one metal, which is selected from the group consisting of gold, silver and palladium, or an alloy thereof. The silver bonding layer preferably contains a sintered body of silver. One side of a ceramic substrate is preferably bonded to the other side of the copper plate or copper-plated plate. A metal base plate is preferably bonded to the other side of the ceramic substrate.

According to the present invention, it is possible to provide an electronic part mounting substrate having an excellent resistance to thermal shock, which has an electronic part bonded on a copper plate or copper-plated plate in such a good bonding state that the number of bonding defects is small and which can maintain the good bonding state if heat cycles are applied thereon, and a method for producing the same.

BEST MODE FOR CARRYING OUT THE INVENTION

Referring now to the accompanying drawings, the preferred embodiment of an electronic part mounting substrate and a method for producing the same according to the present invention will be described below in detail.

Figure 1:
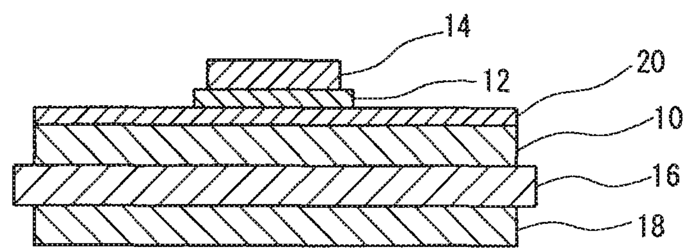
FIG. 1 is a sectional view schematically showing a preferred embodiment of an electronic part mounting substrate according to the present invention.
Figure 2:
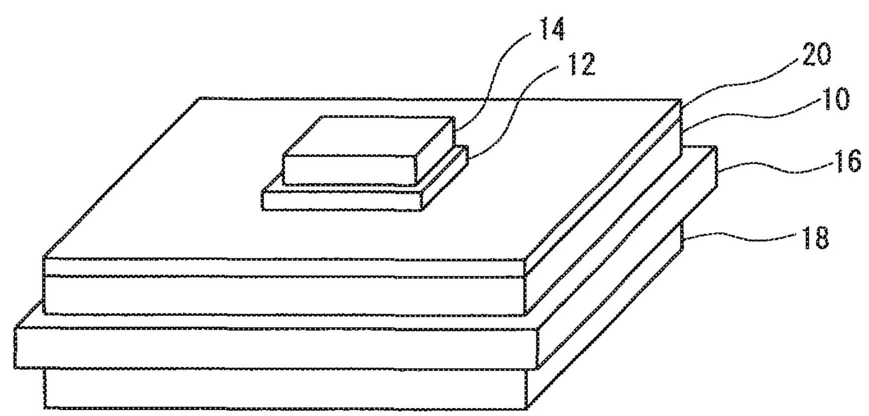
FIG. 2 is a perspective view of the electronic part mounting substrate of FIG. 1.

As shown in FIGS. 1 and 2, in the preferred embodiment of an electronic part mounting substrate, an electronic part 14 is bonded to one major surface of a metal plate 10 (for mounting thereon electronic parts), which has a substantially rectangular planar shape, with a silver bonding layer 12 (containing a sintered body of silver). On the other major surface of the metal plate 10, one major surface of a ceramic substrate 16 having a substantially rectangular planar shape may be bonded. On the other major surface of the ceramic substrate 16, a radiating metal plate (metal base plate) 18 having a substantially rectangular planar shape may be bonded. The one major surface of the metal plate 10 may be plated with copper to form a plating film 20 of copper thereon, and the electronic part 14 may be bonded on the plating film 20 of copper with the silver bonding layer 12.

Furthermore, the metal plate 10 is made of copper, or aluminum or an aluminum alloy (when the plating film 20 of copper is formed). The one major surface (the surface to which the electronic part 14 is to be bonded) of the metal plate 10 (or the surface of the plating film 20 of copper) has a surface roughness of not less than 0.4 μm, and preferably has a surface roughness of from 0.5 to 2.0 μm. The one major surface (the surface to which the electronic part 14 is to be bonded) of the metal plate 10 (or the surface of the plating film 20 of copper) preferably has a Vickers hardness Hv of not greater than 100, and more preferably has a Vickers hardness Hv of not greater than 40.

The surface of the electronic part 14 to be bonded to the one major surface (the surface to which the electronic part 14 is to be bonded) of the metal plate 10 (or the surface of the plating film 20 of copper when the plating film 20 of copper is formed) is preferably covered with a metal, which is capable of being bonded with the silver bonding layer 12, such as at least one metal selected from the group consisting of gold, silver, copper and palladium, or an alloy thereof, and is preferably plated with at least one metal selected from the group consisting of gold, silver and palladium, or an alloy thereof.

In the preferred embodiment of a method for producing an electronic part mounting substrate according to the present invention, there is produced an electronic part mounting substrate wherein the electronic part 14 is mounted on the one major surface (the surface to which the electronic part 14 is to be bonded) of the metal plate 10 (or the surface of the plating film 20 of copper), the metal plate 10 being made of copper, or aluminum or the aluminum alloy (when the plating film 20 of copper is formed). In this method, the one major surface (the surface to which the electronic part 14 is to be bonded) of the metal plate 10 (or the surface of the plating film 20 of copper) is surface-machined to be coarsened so as to have a surface roughness of not less than 0.4 μm (preferably 0.5 to 2.0 μm). Then, after a silver paste is applied on the surface-machined major surface of the metal plate 10 (or surface-machined surface of the plating film 20 of copper) to arrange the electronic part 14 thereon, silver in the silver paste is sintered to form the silver bonding layer 12 to bond the electronic part 14 to the one major surface of the metal plate 10 (or the surface of the plating film 20 of copper) with the silver bonding layer 12.

Before the silver paste is applied after the surface machining is carried out, the one major surface (the surface to which the electronic part 14 is to be bonded) of the metal plate 10 (or the surface of the plating film 20 of copper) is preferably heat-treated to be annealed. By this annealing, the metal plate 10 (or the surface of the plating film 20 of copper) is preferably softened so that the Vickers hardness Hv thereof is decreased to be 40 or less. The heating temperature for this annealing is preferably in the range of from 300° C. to 650° C., and more preferably in the range of from 350° C. to 450° C. The heating time for the annealing is preferably in the range of from 15 minutes to 90 minutes, and more preferably in the range of from 30 minutes to 60 minutes.

Furthermore, the sintering of silver in the silver paste is preferably carried out by heating while pressing the electronic part 14 against the metal plate 10 (or the surface of the plating film 20 of copper). The heating temperature for the sintering is preferably in the range of from 200° C. to 400° C., and more preferably in the range of from 220° C. to 300° C. The heating time for the sintering is preferably in the range of from 1 minute to 10 minutes. The pressure applied for the sintering may be 10 MPa or less, preferably in the range of from 2 MPa to 10 MPa, and more preferably in the range of from 3 MPa to 8 MPa.

On the other major surface of the metal plate 10, the one major surface of the ceramic substrate 16 having a substantially rectangular planar shape may be bonded, and on the other major surface of the ceramic substrate 16, the radiating metal plate (metal base plate) 18 having a substantially rectangular planar shape may be bonded. In this case, after the bonding between the metal plate 10 and the ceramic substrate 16 and the bonding between the ceramic substrate 16 and the meal base plate 18 are carried out, the one major surface (the surface to which the electronic part 14 is to be bonded) of the metal plate 10 (or the surface of the plating film 20 of copper) may be surface-machined to apply the silver paste thereon to arrange the electronic part 14 thereon, and then, silver in the silver paste may be sintered to form the silver bonding layer 12 to bond the electronic part 14 to the one major surface of the metal plate 10 (or the surface of the plating film 20 of copper) with the silver bonding layer 12.

Furthermore, when the metal plate 10 is a plate of copper, the bonding between the metal plate 10 and the ceramic substrate 16 and the bonding between the ceramic substrate 16 and the metal base plate 18 may be carried out by direct bonding or with a brazing filler metal. In these cases, before the bonding between the metal plate 10 and the ceramic substrate 16 (and the bonding between the ceramic substrate 16 and the metal base plate 18) is carried out, the one major surface of the metal plate 10 (or the surface of the plating film 20 of copper) may be surface-machined. In this case, even if the annealing is not carried out by a heat treatment after the surface machining, the metal plate 10 (or the plating film 20 of copper) is heated for the bonding. By this heating, the metal plate 10 (or the surface of the plating film 20 of copper) can be softened so that the Vickers hardness Hv thereof is decreased to be 40 or less.

When the metal plate 10 is made of aluminum or an aluminum alloy, the bonding between the metal plate 10 and the ceramic substrate 16 and the bonding between the ceramic substrate 16 and the metal base plate 18 are preferably carried out by a method comprising the steps of: arranging the ceramic substrate 16 in a mold (not shown); injecting a molten metal of aluminum or an aluminum alloy into the mold so that the molten metal contacts both major surfaces of the arranged ceramic substrate 16; and cooling and solidifying the injected molten metal to form the metal plate 10 and the metal base plate 18 on the major surfaces of the ceramic substrate 16, respectively, to bond them directly to the ceramic substrate 16.

The surface machining is preferably carried out by an abrasive blasting (such as a wet blasting for spraying an abrasive slurry, which contains fine particles in a liquid, onto the surface of a metal plate) or a lapping machining (for sliding and lapping a metal plate, which is arranged on a lapping machine via a lapping agent serving as abrasive grains, while pressing the metal plate thereon).

The silver paste may be a paste containing fine silver particles capable of being sintered at a temperature of not higher than 400° C., and is preferably a bonding agent (e.g., PA-HT-1503M-C commercially available from Dowa Electronics Materials Co., Ltd.) wherein fine silver particles having an average primary particle diameter of 1 to 200 nm coated with an organic compound having 8 or less (preferably 6 to 8) of carbon atoms, such as sorbic acid, are dispersed in a dispersing medium (preferably a polar dispersing medium). The silver paste may be a bonding agent (e.g., PA-HT-1001L commercially available from Dowa Electronics Materials Co., Ltd.) wherein (spherical) silver particles having an average primary particle diameter ($D_{50}$ diameter) of 0.5 to 3.0 μm are dispersed in the dispersing medium in which the fine silver particles are dispersed.

In the preferred embodiment of a method for producing an electronic part mounting substrate according to the present invention, even if the silver paste is heated at a low temperature of about 250 to 260° C. while being pressed at a low pressure of about 5 to 7 MPa when silver in the silver paste is sintered, it is possible to bond the electronic part to the metal plate (the copper plate or copper-plated plate) with a sufficient bonding strength (nearly without forming any bonding defects, such as voids, in the bonding portion).

Throughout the specification, the expression "surface roughness" means an arithmetic surface roughness Ra calculated on the basis of JIS B0601 (2001), and the expression "average primary particle diameter ($D_{50}$ diameter) of silver particles" means the 50% particle diameter ($D_{50}$ diameter) of silver particles (the diameter of cumulative 50% by weight of silver particles) measured by the laser diffractometry, the expression "average primary particle diameter of fine silver particles" meaning an average value of primary particle diameters of fine silver particles obtained from an image of a transmission electron microscope (TEM image).

Examples of an electronic part mounting substrate and a method for producing the same according to the present invention will be described below in detail.

Example 1

First, there were prepared a metal plate (for mounting thereon electronic parts) and metal base plate (for heat radiation) of oxygen-free copper having a size of 48 mm×57 mm×0.25 mm.

Then, one major surface of the metal plate (for mounting thereon electronic parts) was bonded to one major surface of a ceramic substrate of AlN having a size of 49 mm×58 mm×0.64 mm with an Ag—Cu brazing filler metal containing Ti as an active metal, and the metal base plate (for heat radiation) was bonded to the other surface of the ceramic substrate with the brazing filler metal, to prepare a metal/ceramic bonding substrate.

Then, the other surface of the metal plate (for mounting thereon electronic parts) of the metal/ceramic bonding substrate was surface-machined by a wet blasting apparatus (Model No. NFR-737 commercially available from MACOHO Co., Ltd.). As surface machining conditions in the wet blasting apparatus, the air pressure was 0.20 MPa, and the throughput speed was 0.3 m/min. In addition, the distance of projection was 20 mm, and the angle of projection was 90°. Moreover, there was used an abrasive slurry containing 15% by volume of alumina #320 having an average particle diameter of 40 μm as abrasive grains in water. With respect to the metal plate (for mounting thereon electronic parts) surface-machined by the wet blasting, the line roughness along an optional straight line having a length of 100 μm parallel to one side of an optional square area having a size of 100 μm×100 μm on the surface of the metal plate was measured by means of the line roughness measuring function of a super-depth surface profile measuring microscope (or color laser microscope) (VK-8500 commercially available from Keyence Corporation). From the measured line roughness, the surface roughness (arithmetic surface roughness Ra) was calculated on the basis of JIS B0601 (2001). As a result, the surface roughness was 0.81 μm. Furthermore, the Vickers hardness Hv of the other surface of the metal plate was measured at 300 mN/10 s by means of a micro-hardness testing machine (Fischer Scope HM200 commercially available from Helmut Fischer K.K.). As a result, the Vickers hardness Hv was 97.8.

Then, as a silver paste containing fine silver particles and silver particles dispersed in a dispersing medium, there was prepared a silver paste (PA-HT-1001L commercially available from Dowa Electronics Materials Co., Ltd.) wherein the dried powder of aggregates of fine silver particles (silver nanoparticles) having an average primary particle diameter of 100 nm and being coated with sorbic acid, and the powder of spherical silver particles (spherical silver powder 2-1C commercially available from Dowa Electronics Materials Co., Ltd.) having an average primary particle diameter ($D_{50}$ diameter) of 1.0 μm, together with a dispersing agent, were dispersed in a dispersing medium. This silver paste was applied on an electronic part mounting portion of the (surface-machined) surface of the metal plate (for mounting thereon electronic parts). Then, as an electronic part, an Si chip (having a size of 13 mm×13 mm), the bottom face (reverse face) of which was plated with gold, was arranged on the silver paste applied on the electronic part mounting portion. Then, after the Si chip arranged on the metal plate via the silver paste was pre-heated at 100° C. for 10 minutes in the atmosphere, it was heated at 260° C. for 2 minutes while being pressurized at 7 MPa via an Si rubber sheet. Thus, the Si chip was bonded to the metal plate (for mounting thereon electronic parts).

With respect to an electronic part mounting substrate thus produced, the bonded portion of the Si chip to the metal plate (for mounting thereon electronic parts) was observed by ultrasonic test equipment (Scanning Acoustic Tomograph (SAT)) (FineSAT FS100II commercially available from Hitachi Construction Machinery Finetec Co., Ltd.). As a result, no peeling was observed in the bonded portion, and no bonding defects, such as voids, were observed, so that good bonding was achieved.

After a heat cycle, in which the produced electronic part mounting substrate was sequentially held at a temperature of −40° C. for 15 minutes, at a room temperature for 1 minute, at a temperature of 175° C. for 15 minutes and at a room temperature for 1 minute, was repeatedly carried out one hundred times and three hundred times, respectively, the bonding state of the electronic part mounting substrate was observed. At a result, with respect to the electronic part mounting substrate after the heat cycle was repeatedly carried out one hundred times, the bonding of the Si chip to the metal plate (for mounting thereon electronic parts) was good. With respect to the electronic part mounting substrates after the heat cycle was repeatedly carried out three hundred times, the bonding thereof was nearly good (although there was slightly observed a defect state due to bonding defects, such as voids).

Example 2

An electronic part mounting substrate was produced by the same method as that in Example 1, except that the metal/ceramic bonding substrate having the surface-machined metal plate (for mounting thereon electronic parts) was heated to be annealed at 370° C., for 30 minutes in an atmosphere of hydrogen gas as an atmosphere of a reducing gas. Furthermore, after the annealing was carried out, the surface roughness (arithmetic surface roughness Ra) of the (surface-machined) surface of the metal plate (for mounting thereon electronic parts) was 0.77 μm, and the Vickers hardness Hv of the (surface-machined) surface of the metal plate (for mounting thereon electronic parts) was 36.1.

With respect to the electronic part mounting substrate thus produced, the bonded portion of the Si chip to the metal plate (for mounting thereon electronic parts) was observed by the same method as that in Example 1. As a result, no peeling was observed in the bonded portion, so that good bonding was achieved.

The bonding state of the produced electronic part mounting substrate was observed after the same heat cycle as that in Example 1 was repeatedly carried out. At a result, the bonding of the Si chip to the metal plate (for mounting thereon electronic parts) was good after the heat cycle was repeatedly carried out one hundred times and three hundred times.

Comparative Example 1

An electronic part mounting substrate was produced by the same method as that in Example 1, except that the wet blasting was not carried out. Furthermore, the surface roughness (arithmetic surface roughness Ra) of the metal plate (for mounting thereon electronic parts) was 0.09 μm, and the Vickers hardness Hv of the metal plate (for mounting thereon electronic parts) was 35.4.

With respect to the electronic part mounting substrate thus produced, the bonded portion of the Si chip to the metal plate (for mounting thereon electronic parts) was observed by the same method as that in Example 1. As a result, the bonding thereof was nearly good (although a defect state was slightly observed).

The bonding state of the produced electronic part mounting substrate was observed after the same heat cycle as that in Example 1 was repeatedly carried out. At a result, with respect to the electronic part mounting substrate after the heat cycle was repeatedly carried out one hundred times, the bonding thereof was nearly good (although a defect state was slightly observed), or the bonded portion was not peeled although a defect state was observed in a part thereof. With respect to the electronic part mounting substrates after the heat cycle was repeatedly carried out three hundred times, the bonded portion was not peeled although a defect state was observed in a part thereof.

Example 3

First, a ceramic substrate of AlN having a size of 78 mm×95 mm×0.64 mm was arranged in a mold, and a molten metal of aluminum having a purity of 99.9% by weight was injected into the mold so as to contact both major surfaces of the ceramic substrate. Then, the molten metal was cooled and solidified to form a metal plate (for mounting thereon electronic parts) having a size of 68 mm×85 mm×0.2 mm and a metal base plate (for heat radiation) having a size of 68 mm×85 mm×0.2 mm on the major surfaces of the ceramic substrate, respectively, to bond them directly to the major surfaces of the ceramic substrate, respectively.

Then, the metal plate (for mounting thereon electronic parts) was surface-machined by the same wet blasting apparatus as that in Example 1. Furthermore, as surface machining conditions in the wet blasting apparatus, the air pressure was 0.20 MPa, and the throughput speed was 0.3 m/min. In addition, the distance of projection was 30 mm, and the angle of projection was 90°. Moreover, there was used an abrasive slurry containing 15% by volume of alumina #320 having an average particle diameter of 40 μm as abrasive grains in water. With respect to the metal plate (for mounting thereon electronic parts) surface-machined by the wet blasting, the surface roughness (arithmetic surface roughness Ra) was calculated by the same method as that in Example 1. As a result, the surface roughness was 1.6 μm. Furthermore, the Vickers hardness Hv of the metal plate was 29.1.

Then, the surface-machined surface of the metal plate (for mounting thereon electronic parts) was degreased and chemical-polished. The degreased and chemical-polished metal plate (for mounting thereon electronic parts) was dipped in a zinc conversion solution (Subster ZN-111 commercially available from Okuno Chemical Industries, Co., Ltd.) at 25° C. for 30 seconds to be zinc-converted, washed with water, dipped in nitric acid at a room temperature for 30 seconds to be pickled, and washed with water. Then, the metal plate was dipped in the same zinc conversion solution as the above-described zinc conversion solution for 30 seconds to carryout the second zinc conversion, and washed with water to carry out the double zincate conversion process (twice zinc conversion processes) thereof.

Then, the metal plate (for mounting thereon electronic parts) after the double zincate conversion process was dipped in an electroless nickel plating solution (TOP NICOLON TOM-LF commercially available from Okuno Chemical Industries, Co., Ltd.) to form a plating layer of Ni having a thickness of 4 to 5 μm on the metal plate (for mounting thereon electronic parts).

Then, the metal plate (for mounting thereon electronic parts), on which the Ni plating film was formed, was dipped in an electroless copper plating solution (AIS-Adcopper CT commercially available from Okuno Chemical Industries, Co., Ltd.) to form a plating layer of Cu having a thickness of 0.4 to 0.5 μm on the plating layer of Ni formed on the metal plate (for mounting thereon electronic parts).

Furthermore, after the plating layer of Cu was formed, the surface roughness (arithmetic surface roughness Ra) of the surface of the plating layer of Cu on the metal plate (for mounting thereon electronic parts) was 1.6 μm, and the Vickers hardness Hv of the surface thereof was 29.1.

Then, an Si chip was bonded to the plating layer of Cu on the metal plate (for mounting thereon electronic parts) by the same method as that in Example 1, except that the pressure for the bonding was 5 MPa.

With respect to the electronic part mounting substrate thus produced, the bonded portion of the Si chip to the plating layer of Cu on the metal plate (for mounting thereon electronic parts) was observed by the same method as that in Example 1. As a result, no peeling was observed in the bonded portion, so that good bonding was achieved.

After a heat cycle, in which the produced electronic part mounting substrate was sequentially held at a temperature of −40° C. for 15 minutes, at a room temperature for 1 minute, at a temperature of 250° C. for 5 minutes and at a room temperature for 1 minute, was repeatedly carried out one hundred times, three hundred times and one thousand times, respectively, the bonding state of the electronic part mounting substrate was observed. At a result, with respect to the electronic part mounting substrate after the heat cycle was repeatedly carried out one hundred times, three hundred times and one thousand times, the bonding of the Si chip to the plating layer of Cu on the metal plate (for mounting thereon electronic parts) was good.

Comparative Example 2

An electronic part mounting substrate was produced by the same method as that in Example 3, except that buffing was carried out as the surface machining in place of the wet blasting. Furthermore, the surface roughness (arithmetic surface roughness Ra) of the (surface-machined) surface of the plating layer of Cu on the metal plate (for mounting thereon electronic parts) was 0.15 μm, and the Vickers hardness Hv of the metal plate (for mounting thereon electronic parts) was 29.1.

With respect to the electronic part mounting substrate thus produced, the bonded portion of the Si chip to the metal plate (for mounting thereon electronic parts) was observed by the same method as that in Example 3. As a result, no peeling was observed in the bonded portion, so that good bonding was achieved.

The bonding state of the produced electronic part mounting substrate was observed after the same heat cycle as that in Example 3 was repeatedly carried out. At a result, with respect to the electronic part mounting substrate after the heat cycle was repeatedly carried out one hundred times, the bonding of the Si chip to the metal plate (for mounting thereon electronic parts) was good. With respect to the electronic part mounting substrates after the heat cycle was repeatedly carried out three hundred times, the bonding thereof was nearly good (although a defect state was slightly observed), or the bonded portion was not peeled although a defect state was observed in a part thereof. With respect to the electronic part mounting substrates after the heat cycle was repeatedly carried out one thousand times, the bonded portion was not peeled although a defect state was observed in a part thereof.

Example 4

First, a metal/ceramic bonding substrate was produced by bonding metal plates directly to the major surfaces of a ceramic substrate, respectively, by the same method as that in Example 3, except that a ceramic substrate of AlN having a size of 34 mm×31 mm×0.6 mm was arranged in the mold to form a metal plate (for mounting thereon electronic parts) having a size of 30 mm×27 mm×0.4 mm and a metal base plate (for heat radiation) having a size of 30 mm×27 mm×0.4 mm on the major surfaces of the ceramic substrate, respectively. Then, the surface machining and double zincate conversion process for the metal plates were carried out, and the plating layer of Ni and the plating layer of Cu were formed. Furthermore, after the plating layer of Cu was formed, the surface roughness (arithmetic surface roughness Ra) of the surface of the plating layer of Cu on the metal plate (for mounting thereon electronic parts) was 1.5 μm, and the Vickers hardness Hv thereof was 29.0.

Then, the same silver paste as that in Example 1 was applied on an electronic part mounting portion of the surface of the plating layer of Cu on the metal plate (for mounting thereon electronic parts) of the produced metal/ceramic bonding substrate. Then, an Si chip (an Si chip having a size of 7 mm×7 mm, the bottom face (reverse face) of which was covered with a plating layer of Ti having a thickness of 1 μm and a plating layer of Ni having a thickness of 3 μm (thereon) as underlying layers which are plated with gold) was arranged on the silver paste as an electronic part. After the temperature in an atmosphere of nitrogen was raised at a rise of temperature rise of 1° C./s to 250° C., the Si chip arranged on the silver paste was heated at 250° C. for 5 minutes in the atmosphere of nitrogen while being pressurized at 6 MPa. Thus, the Si chip was bonded to the plating layer of Cu on the metal plate (for mounting thereon electronic parts).

With respect to the electronic part mounting substrate thus produced, the bonded portion of the Si chip to the plating layer of Cu on the metal plate (for mounting thereon electronic parts) was observed by ultrasonic test equipment (Scanning Acoustic Tomograph (SAT)) (FineSAT FS100II commercially available from Hitachi Construction Machinery Finetec Co., Ltd.). As a result, no peeling was observed in the bonded portion, so that good bonding was achieved. The shear strength of the bonded portion of the Si chip to the metal plate (for mounting thereon electronic parts) was measured by a shear strength measuring apparatus (DAGE 200 commercially available from RISI Co., Ltd.). As a result, the shear strength was 40 MPa or more, so that good bonding was achieved.

With respect to the produced electronic part mounting substrate, the bonding state was observed by the SAM after the same heat cycle as that in Example 3 was repeatedly carried out one hundred times, five hundred times and one thousand times. At a result, with respect to the electronic part mounting substrate after the heat cycle was repeatedly carried out one hundred times, five hundred times and one thousand times, the bonding of the Si chip to the plating layer of Cu on the metal plate (for mounting thereon electronic parts) was good. The shear strength of the bonded portion of the Si chip to the metal plate (for mounting thereon electronic parts) was measured after the same heat cycle as that in Example 3 was repeatedly carried out one hundred times, five hundred times and one thousand times. At a result, the shear strength was 40 MPa or more with respect to the electronic part mounting substrate after the heat cycle was repeatedly carried out one hundred times and fine hundred times, and the shear strength was 29 MPa with respect to the electronic part mounting substrate after the heat cycle was repeatedly carried out one thousand times, so that good bonding was achieved.

The invention claimed is:

1. A method for producing an electronic part mounting substrate wherein an electronic part is mounted on one side of a copper plate or copper-plated plate, the method comprising the steps of:

surface-machining the one side of the copper plate or copper-plated plate to cause the surface roughness thereof to be 0.4 μm or more;

applying a silver paste on the surface-machined side of the copper plate or copper-plated plate;

arranging the electronic part on the silver paste applied on the surface-machined side of the copper plate or copper-plated plate; and sintering silver in the silver paste to form a silver bonding layer to bond the electronic part to the surface-machined side of the copper plate or copper-plated plate with the silver bonding layer, wherein said copper plate or copper-plated plate is annealed before said silver paste is applied after said surface machining is carried out.

2. A method for producing an electronic part mounting substrate as set forth in claim 1, wherein said surface machining is a wet blasting.

3. A method for producing an electronic part mounting substrate as set forth in claim 1, wherein said annealing causes said copper plate or copper-plated plate to have a Vickers hardness Hv of not greater than 40.

4. A method for producing an electronic part mounting substrate as set forth in claim 1, wherein said sintering is carried out by heating while pressing said electronic part against said copper plate or copper-plated plate.

5. A method for producing an electronic part mounting substrate as set forth in claim 1, wherein a surface of said electronic part to be bonded to said surface-machined side of the copper plate or copper-plated plate is plated with at least one metal, which is selected from the group consisting of gold, silver and palladium, or an alloy thereof.

6. A method for producing an electronic part mounting substrate as set forth in claim 1, wherein one side of a ceramic substrate is bonded to the other side of said copper plate or copper-plated plate.

7. A method for producing an electronic part mounting substrate as set forth in claim 6, wherein a metal base plate is bonded to the other side of said ceramic substrate.

* * * * *